(12) United States Patent  
Stowe et al.

(10) Patent No.: US 9,126,452 B2  
(45) Date of Patent: Sep. 8, 2015

(54) ULTRA-FINE TEXTURED DIGITAL LITHOGRAPHIC IMAGING PLATE AND METHOD OF MANUFACTURE

(71) Applicants: Palo Alto Research Center Incorporated, Palo Alto, CA (US); Xerox Corporation, Norwalk, CT (US)

(72) Inventors: Timothy D. Stowe, Alameda, CA (US); Sourobh Raychaudhuri, Mountain View, CA (US); Carolyn P. Moorlag, Mississauga (CA); Michael Y. Young, Cupertino, CA (US)

(73) Assignees: Xerox Corporation, Norwalk, CT (US); Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/953,674

(22) Filed: Jul. 29, 2013

(65) Prior Publication Data

US 2015/0027982 A1    Jan. 29, 2015

(51) Int. Cl.
| | |
|---|---|
| *B44C 1/22* | (2006.01) |
| *B41N 10/02* | (2006.01) |
| *B41N 1/00* | (2006.01) |
| *B41N 1/12* | (2006.01) |
| *H01L 21/311* | (2006.01) |
| *B41N 1/22* | (2006.01) |
| *B41N 10/00* | (2006.01) |
| *B41C 1/04* | (2006.01) |

(Continued)

(52) U.S. Cl.
CPC ............... *B41N 10/02* (2013.01); *B41N 1/003* (2013.01); *B41N 1/12* (2013.01); *B41C 1/04* (2013.01); *B41C 1/05* (2013.01); *B41C 1/1033* (2013.01); *B41M 1/06* (2013.01); *B41N 1/22* (2013.01); *B41N 10/00* (2013.01); *H01L 21/31111* (2013.01)

(58) Field of Classification Search  
None  
See application file for complete search history.

(56) References Cited

U.S. PATENT DOCUMENTS

| | | | |
|---|---|---|---|
| 3,285,741 A | 11/1966 | Gesierich | |
| 3,741,118 A | 6/1973 | Carley | |

(Continued)

FOREIGN PATENT DOCUMENTS

| | | |
|---|---|---|
| DE | 10 2008 062741 A1 | 4/2008 |
| EP | 1935640 A2 | 6/2008 |

OTHER PUBLICATIONS

U.S. Appl. No. 13/095,714, Apr. 27, 2011, Stowe et al.

(Continued)

*Primary Examiner* — Shamim Ahmed  
*Assistant Examiner* — Bradford Gates  
(74) *Attorney, Agent, or Firm* — Ronald E. Prass, Jr.; Prass LLP

(57) ABSTRACT

A method of forming an imaging blanket for a printing apparatus comprises preparing a support structure (e.g., mold) for receipt of a polymer blanket compound, introducing the polymer blanket compound in liquid state over the support structure, curing the polymer blanket compound to produce an imaging blanket, releasing the imaging blanket from the support structure, and etching a surface of the imaging blanket to form a texture pattern therein, the surface forming an imaging surface of said imaging blanket. An imaging surface providing desirable dampening fluid retention is provided. Wet etch, dry etch or a combination of both may be used. The polymer may be a silicone compound, may include 3 percent by weight granular material.

20 Claims, 22 Drawing Sheets

(51) Int. Cl.
  *B41C 1/05* (2006.01)
  *B41C 1/10* (2006.01)
  *B41M 1/06* (2006.01)

(56) References Cited

U.S. PATENT DOCUMENTS

| | | | |
|---|---|---|---|
| 3,800,699 | A | 4/1974 | Carley |
| 3,877,372 | A | 4/1975 | Leeds |
| 5,493,971 | A | 2/1996 | Lewis et al. |
| 5,701,815 | A | 12/1997 | Bocko |
| 5,716,700 | A * | 2/1998 | Kikukawa et al. ............ 428/339 |
| 5,819,661 | A | 10/1998 | Lewis et al. |
| 5,829,353 | A * | 11/1998 | Ellis ............................ 101/460 |
| 5,855,173 | A | 1/1999 | Chatterjee et al. |
| 5,890,430 | A | 4/1999 | Wirz |
| 6,125,756 | A | 10/2000 | Nussel et al. |
| 6,146,798 | A | 11/2000 | Bringans et al. |
| 6,318,264 | B1 | 11/2001 | D'Heureuse et al. |
| 6,374,737 | B1 | 4/2002 | Bennett et al. |
| 6,520,084 | B1 | 2/2003 | Gelbart |
| 6,631,679 | B2 | 10/2003 | Bennett et al. |
| 6,715,420 | B2 | 4/2004 | Blake et al. |
| 6,725,777 | B2 | 4/2004 | Katano |
| 7,100,503 | B2 | 9/2006 | Wiedemer et al. |
| 7,191,705 | B2 | 3/2007 | Berg et al. |
| 2002/0121204 | A1 | 9/2002 | Bennett et al. |
| 2003/0000409 | A1 | 1/2003 | Blake et al. |
| 2003/0086737 | A1 * | 5/2003 | Shida et al. ................... 399/330 |
| 2003/0165774 | A1 | 9/2003 | Arias et al. |
| 2003/0167950 | A1 | 9/2003 | Mori |
| 2004/0011234 | A1 | 1/2004 | Figov et al. |
| 2005/0178281 | A1 | 8/2005 | Berg et al. |
| 2005/0258136 | A1 | 11/2005 | Kawanishi et al. |
| 2007/0199457 | A1 | 8/2007 | Cyman, Jr. et al. |
| 2007/0199458 | A1 | 8/2007 | Cyman, Jr. et al. |
| 2007/0199459 | A1 | 8/2007 | Cyman, Jr. et al. |
| 2007/0199460 | A1 | 8/2007 | Cyman, Jr. et al. |
| 2007/0199461 | A1 | 8/2007 | Cyman, Jr. et al. |
| 2007/0199462 | A1 | 8/2007 | Cyman, Jr. et al. |
| 2008/0032072 | A1 | 2/2008 | Taniuchi |
| 2008/0223240 | A1 | 9/2008 | Drury |
| 2008/0286016 | A1 * | 11/2008 | Kawamura et al. ............ 399/286 |
| 2009/0102089 | A1 * | 4/2009 | Chen et al. .................... 264/225 |
| 2009/0229857 | A1 * | 9/2009 | Fredenberg et al. ....... 174/126.2 |
| 2009/0309098 | A1 * | 12/2009 | Balucani ......................... 257/48 |
| 2010/0031838 | A1 | 2/2010 | Lewis et al. |
| 2011/0111194 | A1 * | 5/2011 | Carre et al. .................... 428/215 |
| 2012/0038881 | A1 * | 2/2012 | Amirparviz et al. ...... 351/160 R |
| 2012/0103221 | A1 * | 5/2012 | Stowe et al. .................... 101/483 |
| 2012/0139137 | A1 * | 6/2012 | Qiu ................................ 264/1.36 |
| 2012/0171869 | A1 * | 7/2012 | Morikawa et al. ............ 438/703 |

OTHER PUBLICATIONS

U.S. Appl. No. 13/095,737, Apr. 27, 2011, Stowe et al.
U.S. Appl. No. 13/095,745, Apr. 27, 2011, Stowe et al.
U.S. Appl. No. 13/095,757, Apr. 27, 2011, Stowe et al.
U.S. Appl. No. 13/095,764, Apr. 27, 2011, Stowe et al.
U.S. Appl. No. 13/095,773, Apr. 27, 2011, Stowe et al.
U.S. Appl. No. 13/095,778, Apr. 27, 2011, Stowe et al.
U.S. Appl. No. 13/204,515, Aug. 5, 2011, Stowe et al.
U.S. Appl. No. 13/204,526, Aug. 5, 2011, Stowe et al.
U.S. Appl. No. 13/204,548, Aug. 5, 2011, Stowe et al.
U.S. Appl. No. 13/204,560, Aug. 5, 2011, Pattekar et al.
U.S. Appl. No. 13/204,567, Aug. 5, 2011, Stowe et al.
U.S. Appl. No. 13/204,578, Aug. 5, 2011, Stowe et al.
U.S. Appl. No. 13/366,947, Feb. 6, 2012, Biegelsen.
U.S. Appl. No. 13/426,209, Mar. 21, 2012, Liu et al.
U.S. Appl. No. 13/426,262, Mar. 21, 2012, Liu et al.
U.S. Appl. No. 13/548,134, Jul. 12, 2012, Veres et al.
U.S. Appl. No. 13/548,146, Jul. 12, 2012, Veres et al.
U.S. Appl. No. 13/548,151, Jul. 12, 2012, Veres et al.
U.S. Appl. No. 13/548,155, Jul. 12, 2012, Veres et al.
U.S. Appl. No. 13/548,127, Jul. 12, 2012, Veres et al.
U.S. Appl. No. 13/548,157, Jul. 12, 2012, Veres et al.
Shen et al., "A new understanding on the mechanism of fountain solution in the prevention of ink transfer to the non-image area in conventional offset lithography", J. Adhesion Sci. Technol., vol. 18, No. 15-16, pp. 1861-1887 (2004).
Katano et al., "The New Printing System Using the Materials of Reversible Change of Wettability", International Congress of Imaging Science 2002, Tokyo, pp. 297 et seq. (2002).

* cited by examiner

| SAMPLE # | WET ETCH TIME [m] | MATERIAL | SURFACE | Ra[um] | Rq[um] | Rz[um] | Rt[um] | CONTACT ANGLE [deg] | DUROMETER (SHORE A) |
|---|---|---|---|---|---|---|---|---|---|
| C0 | 0 | 3:50:100 (C:T:TK) | GLASS MOLD | 0.11494 | 0.20772 | 7.09 | 28.95 | 107.0 | |
| TK0 | 0 | OUT OF BOTTLE BLACK | GLASS MOLD | 0.11197 | 0.13294 | 1.09 | 1.38 | 110.4 | |
| TC0 | 0 | OUT OF BOTTLE CLEAR | GLASS MOLD | 0.0479 | 0.06456 | 0.7727 | 0.97176 | 103.4 | |
| C1 | 5 | 3:50:100 (C:T:TK) | GLASS MOLD | 0.5462 | 1.43 | 77.08 | 79.1 | 109.0 | |
| TK1 | 5 | OUT OF BOTTLE BLACK | GLASS MOLD | 0.15155 | 0.26185 | 20.75 | 58.05 | 107.1 | |
| TC1 | 5 | OUT OF BOTTLE CLEAR | GLASS MOLD | 0.07851 | 0.16087 | 7.01 | 36.1 | 107.5 | |
| C2 | 10 | 3:50:100 (C:T:TK) | GLASS MOLD | 2.56 | 4.41 | 91.84 | 95.72 | 123.4 | |
| TK2 | 10 | OUT OF BOTTLE BLACK | GLASS MOLD | 0.2261 | 0.41266 | 45.95 | 74.62 | 110.6 | |
| TC2 | 10 | OUT OF BOTTLE CLEAR | GLASS MOLD | 0.17525 | 0.4278 | 47.82 | 75.9 | 105.1 | 48.2 |
| SF | 0 | 3:50:100 (C:T:TK) | BLACK ON ORANGE | 1.45 | 2.72 | 94.56 | 100.92 | 116.5 | 62 |
| SF | 0 | 3:50:100 (C:T:TK) | BLACK ON ORANGE | | | | | | 73.4 |
| SF | 0 | 3:50:100 (C:T:TK) | BLACK ON ORANGE | | | | | | 17 |

FIG. 6

ULTRA-FINE TEXTURED DIGITAL LITHOGRAPHIC IMAGING PLATE AND METHOD OF MANUFACTURE

BACKGROUND

The present disclosure is related to marking and printing systems, and more specifically to an element of such a system having a controlled surface roughness and oleophobicity.

Offset lithography is a common method of printing today. (For the purposes hereof, the terms "printing" and "marking" are interchangeable.) In a typical lithographic process an imaging plate, which may be a flat plate-like element, the surface of a cylinder, or belt, etc., is formed to have "image regions" formed of hydrophobic and oleophilic material, and "non-image regions" formed of a hydrophilic material. The image regions are regions corresponding to the areas on the final print (i.e., the target substrate) that are occupied by a printing or marking material such as ink, whereas the non-image regions are the regions corresponding to the areas on the final print that are not occupied by said marking material. The hydrophilic regions accept and are readily wetted by a water-based fluid, commonly referred to as a fountain or dampening fluid (typically consisting of water and a small amount of alcohol as well as other additives and/or surfactants to reduce surface tension). The hydrophobic regions repel dampening fluid and accept ink, whereas the dampening fluid formed over the hydrophilic regions forms a fluid "release layer" for rejecting ink. Therefore the hydrophilic regions of the imaging plate correspond to unprinted areas, or "non-image areas", of the final print.

The ink may be transferred directly to a substrate, such as paper, or may be applied to an intermediate surface, such as an offset (or blanket) cylinder in an offset printing system. In the latter case, the offset cylinder is covered with a conformable coating or sleeve with a surface that can conform to the texture of the substrate, which may have surface peak-to-valley depth somewhat greater than the surface peak-to-valley depth of the blanket. Sufficient pressure is used to transfer the image from the blanket or offset cylinder to the substrate.

The above-described lithographic and offset printing techniques utilize plates which are permanently patterned with the image to be printed (or its negative), and are therefore useful only when printing a large number of copies of the same image (long print runs), such as magazines, newspapers, and the like. These methods do not permit printing a different pattern from one page to the next (referred to herein as variable printing) without removing and replacing the print cylinder and/or the imaging plate (i.e., the technique cannot accommodate true high speed variable printing wherein the image changes from impression to impression, for example, as in the case of digital printing systems).

Lithography and the so-called waterless process provide very high quality printing, in part due to the quality and color gamut of the inks used. Furthermore, these inks, which typically have very high color pigment content, are very low cost compared to toners and many other types of marking materials. Thus, while there is a desire to use the lithographic and offset inks for printing in order to take advantage of the high quality and low cost, there is also a desire to print variable data from page to page.

One problem encountered is that offset inks have too high a viscosity (often well above 50,000 cps) to be useful in typical variable printing systems such as nozzle-based inkjet systems. In addition, because of their tacky nature, offset inks have very high surface adhesion forces relative to electrostatic forces and are therefore very difficult to manipulate onto or off of a surface using electrostatics. (This is in contrast to dry or liquid toner particles used in xerographic/electrographic systems, which have low surface adhesion forces due to their particle shape and the use of tailored surface chemistry and special surface additives.)

Efforts have been made to create lithographic and offset printing systems for variable data in the past. One example is disclosed in U.S. Pat. No. 3,800,699, incorporated herein by reference, in which an intense energy source such as a laser is used to pattern-wise evaporate a dampening fluid.

In another example disclosed in U.S. Pat. No. 7,191,705, incorporated herein by reference, a hydrophilic coating is applied to an imaging belt. A laser selectively heats and evaporates or decomposes regions of the hydrophilic coating. Next, a water-based dampening fluid is applied to these hydrophilic regions rendering them oleophobic. Ink is then applied and selectively transfers onto the plate only in the areas not covered by dampening fluid, creating an inked pattern that can be transferred to a substrate. Once transferred, the belt is cleaned, a new hydrophilic coating and dampening fluid are deposited, and the patterning, inking, and printing steps are repeated, for example for printing the next batch of images.

In yet another example, a rewritable surface is utilized that can switch from hydrophilic to hydrophobic states with the application of thermal, electrical, or optical energy. Examples of these surfaces include so called switchable polymers and metal oxides such as $ZnO_2$ and $TiO_2$. After changing the surface state, dampening fluid selectively wets the hydrophilic areas of the programmable surface and therefore rejects the application of ink to these areas.

In general, the dampening fluid is applied as a relatively thin layer over an image plate. A certain amount of surface roughness is required in order to retain the dampening fluid thereover. In some commercially available imaging systems, specific non-printing areas are defined by a surface with an adequate surface roughness targeted to retain the thin layer of dampening fluid. Providing surface roughness is in part a function of the material forming the imaging plate. Metal imaging plates are susceptible to a variety of texturing methods, such as etching, anodizing, and so on.

A family of variable data lithography devices has been developed that use a structure to perform both the functions of a traditional plate and of a traditional blanket to retain a patterned fountain solution for inking, and to delivering that ink pattern to a substrate. See U.S. patent application Ser. No. 13/095,714, incorporated herein by reference. A blanket performing both of these functions is referred to herein as an imaging blanket. The blanket in such devices retains a dampening fluid, requiring that its surface have a selected texture. Texturing of such a structure has heretofore not been optimized.

SUMMARY

Accordingly, the present disclosure is directed to systems and processes providing native elastomeric polymer etching used to define an ultra-fine surface texturing of an imaging blanket. Such an imaging blanket, with such an ultra-fine surface texture, may retain a very thin layer of dampening fluid that defines the dark field non-printing surface area, while also being appropriately conformable to the substrate for ink transfer thereto According to one aspect of the disclosure, a method of forming an imaging blanket for a printing apparatus, comprises preparing a support structure (e.g., mold structure) for receipt of an elastomeric polymer blanket compound; introducing the elastomeric polymer blanket compound in liquid state over the support structure; curing the elastomeric polymer blanket compound to produce an imaging blanket; releasing the imaging blanket from the support structure; and etching a surface of the imaging blanket to form a texture pattern therein, the surface forming an imaging surface of said imaging blanket Implementations of this aspect may include the elastomeric polymer blanket compound comprising fluorocarbon elastomer, fluorosilicone rubber, silicone, or other polymer, possibly including approximately 3-25 percent by weight granular material (e.g., carbon), and possibly comprising a dark tint material. Implementations of this aspect may also include the elastomeric polymer blanket compound including a granular material such as carbon black, such that the etching provides a greater rate of material removal for the elastomeric polymer than for the granular material. (Alternatively, the etching may provide a greater rate of material removal for the granular material than for the elastomeric polymer.) Therefore, the surface develops a texture based at least in part by the size and distribution of the granular material.

According to another aspect of the disclosure the imaging surface is formed over a glass surface of a mold. According to yet another aspect of the disclosure the mold structure is open at one surface for introducing the liquid blanket compound, the imaging surface being a surface formed at said one open surface and air cured.

According to still further aspects of the disclosure, the etch process may be a dry etch, wet etch, or a combination of dry and wet etch. In the case of a dry etch, the etch process may be an anisotropic reactive ion etching process using a combination of $CF_4$ and $O_2$ species. In the case of a wet etch, the etch process may comprise application of a solution of TBAF and NMP to the imaging surface.

In certain embodiments, an imaging surface may be provided having a periodic surface roughness, Ra, of substantially between 0.5 and 1.5 microns.

The above is a brief summary of a number of unique aspects, features, and advantages of the present disclosure. The above summary is provided to introduce the context and certain concepts relevant to the full description that follows. However, this summary is not exhaustive. The above summary is not intended to be nor should it be read as an exclusive identification of aspects, features, or advantages of the claimed subject matter. Therefore, the above summary should not be read as imparting limitations to the claims nor in any other way determining the scope of said claims.

BRIEF DESCRIPTION OF THE DRAWINGS

In the drawings appended hereto like reference numerals denote like elements between the various drawings. While illustrative, the drawings are not drawn to scale. In the drawings:

FIG. 6 is a table of data for various measures of roughness for etching experiments according to the present disclosure.

DETAILED DESCRIPTION

Figure 1:
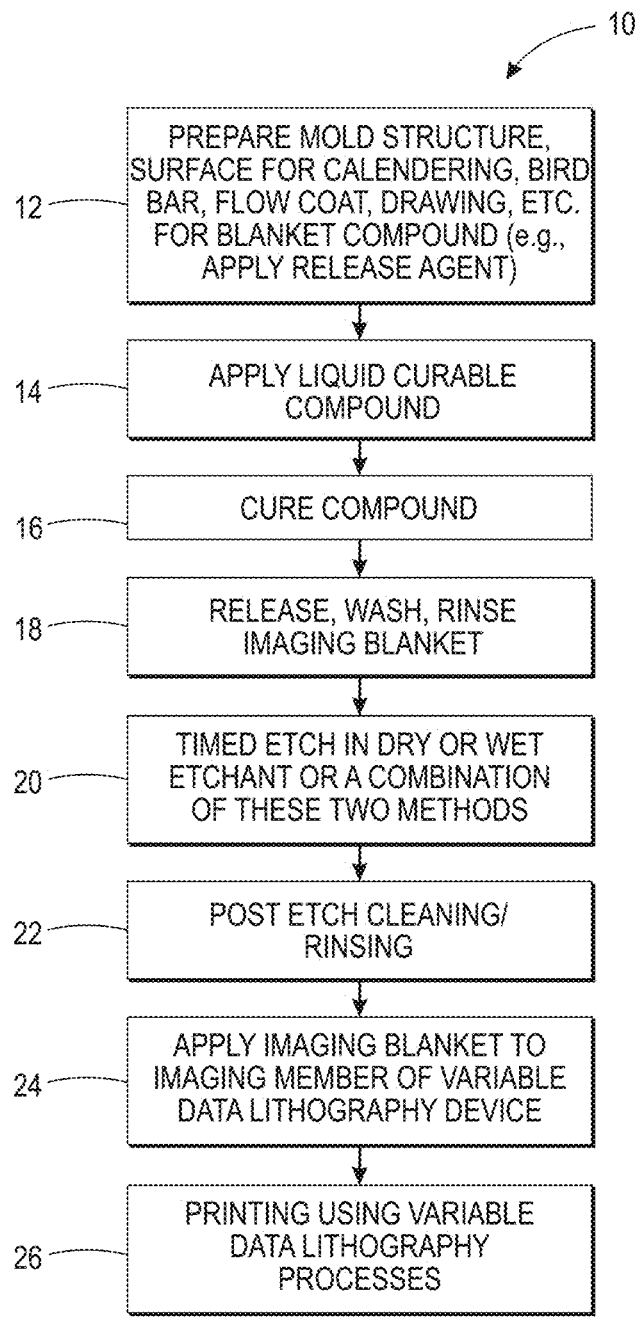
FIG. 1 is a flow chart of an exemplar method of fabricating an imaging blanket, for example for use in a variable data lithography device, according to one aspect of the present disclosure.

We initially point out that description of well-known starting materials, processing techniques, components, equipment and other well-known details may merely be summarized or are omitted so as not to unnecessarily obscure the details of the present disclosure. Thus, where details are otherwise well known, we leave it to the application of the present disclosure to suggest or dictate choices relating to those details.

Many of the examples mentioned herein are directed to an imaging blanket (including, for example, a printing sleeve, belt, drum, and the like) that has a uniformly grained and textured blanket surface that is ink-patterned for printing. In a still further example of variable data lithographic printing, such as disclosed in U.S. patent application Ser. No. 13/095,714, a direct central impression printing drum having a low durometer elastomeric polymer imaging blanket is employed, over which for example, a dampening fluid may be formed and inked. Such an elastomeric polymer imaging blanket requires, among other parameters, a unique specification on surface roughness (for dampening fluid retention), radiation absorptivity (for dampening fluid patterning), oleophobicity (for ink separation), conformability (for transfer of ink to a substrate), etc.

The controlled surface roughness has the function of retaining a relatively very thin (for example, on the order of 200 nm) dampening fluid layer for subsequent selective removal, for example by an incident near-infrared (IR) laser beam. Specific patterns of features, features shape and size, and other surface characteristics are formed, such as by molding, into the surface of the elastomeric polymer imaging blanket.

According to this disclosure, a method of surface texturing a variable data lithography imaging blanket having an elastomeric polymer surface is disclosed. According to certain embodiments, the method comprises polymer surface etching. The elastomeric polymer (such as fluorocarbon elastomer, fluorosilicone rubber, silicone, etc.) imaging blankets are often formed over a support structure, such as by molding (or equivalently, casting), calendaring, using a bird bar, flow-coating or using a draw down process. We refer in the following to molding as one example, with the understanding that other processes of forming an imaging blanket are contemplated herein.

Typical as-molded elastomeric polymer surfaces have a high surface gloss, especially on the molded face surface. In contrast, an etched polymer surface has a matte and dull appearance. This ultra-fine textured surface is used to retain the thin layer of dampening fluid. The thickness is a balance of a number of factors, including providing rejection of the printing ink and ease of removal of the fluid so as to accept the printing ink in surface areas corresponding to where a substrate is to be printed. While acceptance of the printing ink is controlled at least in part by the elastomeric polymer material properties at the surface, surface roughness of the imaging blanket is one key factor that determines the thickness and efficiency of retaining the dampening fluid.

In some embodiments, it is desirable to provide an elastomeric polymer imaging blanket having a peak-to-valley surface roughness that is uniform and can retain dampening fluid for greater than 4 seconds. While fluorocarbon elastomers (such as Viton, from DuPont, Inc.) are examples of elastomeric polymers that may be used as imaging blankets, other materials such as fluorosilicone rubber (FVMQ), silicone, etc. are contemplated herein. Forming a metal imaging plate by known methods such as using an anodized aluminum surface or using beads on the order of micron-scale can lead to non-uniform surface height variations. The imaging plate surface may be textured, for example, by ablating the imaging plate surface such as by polishing paper or laser tool. Alternatively, a bead-slurry with a controlled bead size can be applied to the imaging plate surface. Bead slurry has been found to cause bead clumps and create surface texture variations. In general, surface uniformity using these methods is not optimal, especially when the lateral periodic structure requirement is in the single digit micron scale. Multimode surface height distributions have been observed for these plate surfaces. These variations in peak-to-valley height can lead to varying thicknesses of dampening fluid which impacts variable data ink printing quality and reliability.

For certain embodiments of variable data printing, it is desirable to have the imaging blanket reject the oil-based printing ink so that the deposited ink image can be transferred to paper. Cured silicone material such as Dow Toray SE9187 black silicone (Dow Corning Company) exhibits such oleophobic behavior and rejects the printing ink as desired. Dow Toray SE9187 black silicone is a single-component system having a viscosity of 1000 cP. We have found it helpful to dilute the polymer with various diluents for our blanket forming work (such as, toluene, heptane, ethanol—dilutions range from 2:1 to 1:4 silicone-to-diluent). According to certain embodiments, for casting viscosity may be less than 300 cps. Other fluorocarbon elastomers, fluorosilicone rubber, and one- or two-component silicone systems, and certain other non-silicone-based systems, can also be engineered to exhibit such oleophobic behavior as well.

In certain embodiments, the textured surface elastomeric polymer imaging blanket should be capable of absorbing electromagnetic radiation energy to vaporize a very thinly coated dampening fluid layer, for example to form ink receiving regions, during printing. Therefore, according to certain embodiments, the elastomeric polymer system may further incorporate carbon powder or carbon nanotubes with a loading concentration of about 3 to 25 percent by weight to facilitate the surface absorption of electromagnetic radiation energy. Other radiation-absorbing particulates may also be used together with or in place of the carbon material. (In other embodiments, the particulates need not be radiation absorptive, but provide an etching rate differential as compared to the imaging blanket matrix material.)

As was mentioned previously, it is desirable to have a textured imaging blanket surface with uniform peak-to-valley height. According to one embodiment disclosed herein, this can be accomplished by forming an imaging blanket surface, then etching that surface, such as by using a dry or wet etch. Fine lateral semi-periodic texture with controllable peak to valley heights may thereby be obtained. Dampening fluid retention ability and inking ability of the textured imaging blanket surface is improved as compared to known imaging blanket surface formation methods.

An exemplary method 10 according to this embodiment is illustrated in FIG. 1. At step 12, a mold is prepared for the formation of an imaging blanket. For example, such preparation may include cleaning and applying a layer of material to assist with release of the blanket compound after molding, such as a thin layer of Parylene (on the order of 2 microns thick). At step 14 a curable blanket compound, such as one of the aforementioned elastomeric polymer compounds in liquid form, is poured into the mold. To permit flow of the polymer compound within the mold, the viscosity of the polymer may be controlled by the addition of selected additives (such as mentioned above). At step 16 the liquid polymer compound is cured, such as at room temperature, overnight for such time and under such conditions as the specific polymer compound warrants. The cured elastomeric polymer imaging blanket is then removed from the template, washed, and rinsed at step 18.

The surface of the imaging blanket that is ultimately to receive the dampening fluid/ink, referred to herein as the imaging surface, is then textured by dry etching, wet etching, or a combination of the two etching formats, at step 20. Specific examples of dry and wet etch conditions and methods are provided below. The elastomeric polymer imaging blanket may then be cleaned and rinsed at 22. The imaging blanket may then be disposed on an appropriate carrier in a printing system at 24, and used in a variable data lithographic process at 26, as described further below.

As mentioned, etching of the elastomeric polymer imaging surface may be by dry or wet etching. In the formed case, the dry etch can operate at a low gas pressure or an atmospheric gas pressure or a high gas pressure regime. The operating temperature can be maintained below room temperature, at room temperature or an elevated temperature (for example to promote increased reaction rates). The dry etch can be a gas plasma and can operate in the AC voltage mode or the Reactive Ion Etch (RIE) mode with AC and/or DC bias conditions. Dry etch gases may include fluoride- or chlorine-based gases in which the excited plasma radicals can react with the polymer substrate and produce volatile end products that are carried away downstream. Specific examples for the etch gases include $CF_4$ and $SF_6$ etch gases (+optional $O_2$ gas). In the latter case, the wet etch can be a dip etch, a sprayed etched or a dispensed etch. The etch solution can be an acidic or an alkaline solution. The etch bath temperature can be controlled to achieve an optimum etch condition. Specific examples for the etchant include tetra-n-butylammonium fluoride (TBAF)+N-methyl-2-pyrrolidone (NMP) solution.

Figure 2:
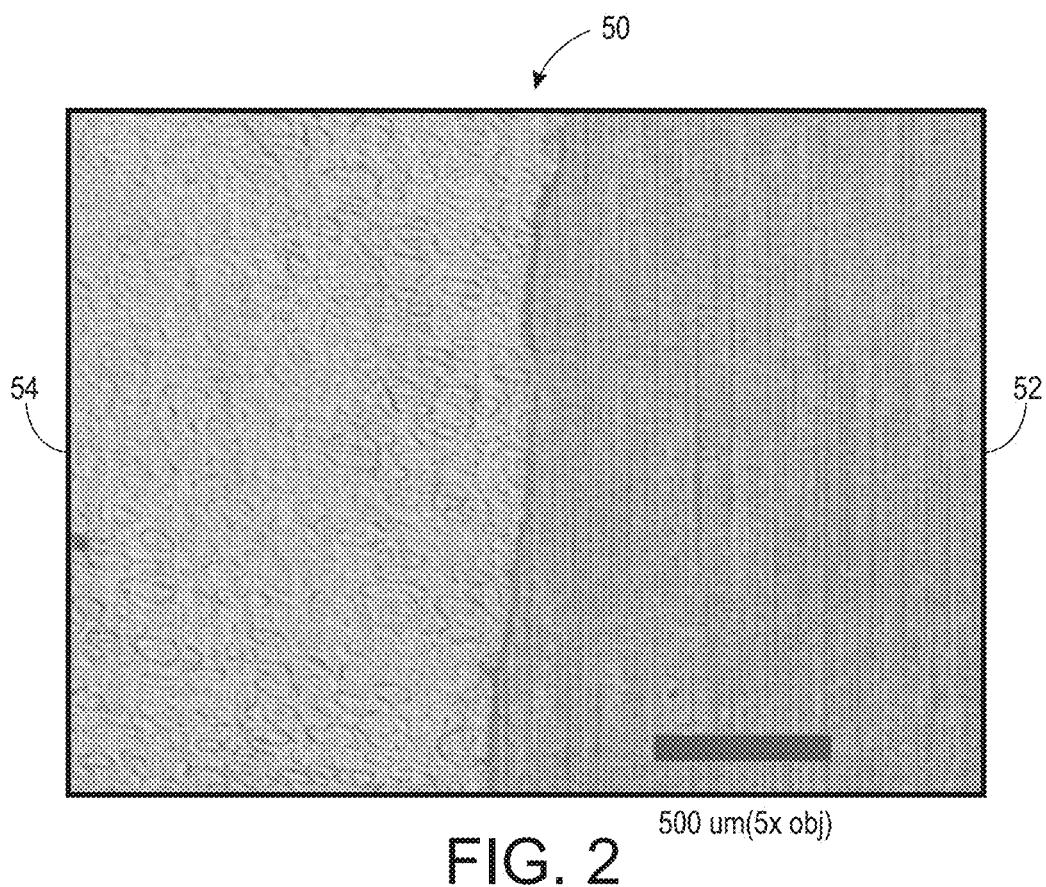
FIG. 2 is a magnified view of a sample of a silicone imaging surface prepared with a region subjected to an isotropic dry etch process, and a region protected from the dry etch process.
Figure 3A:
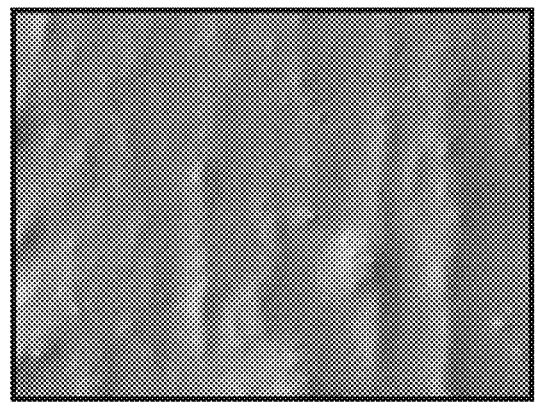
FIGS. 3A and 3B are greater magnification images of the imaging surface subjected to an isotropic dry etch process and a region protected from the dry etch process, respectively, of FIG. 2.
Figure 3B:
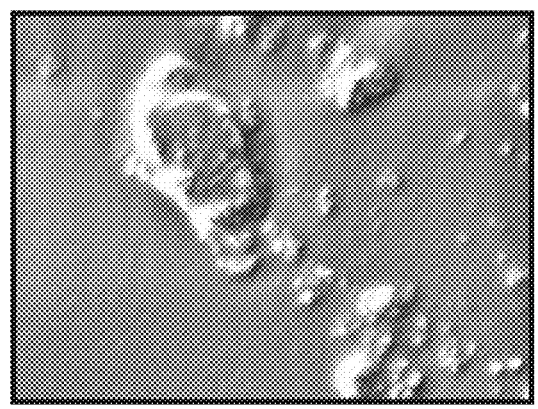

With reference to FIG. 2, shown therein is a magnified (5×) view of a single sample of a silicone imaging surface 50 prepared with a region 52 subjected to an isotropic $CF_4+O_2$ dry etch process (20 min., 400 W), and a region 54 protected from the dry etch process. With reference also to FIGS. 3A and 3B, the regions illustrated in FIG. 2 are shown under greater magnification (1500×). As can be seen, and as would be expected, the etched region shows a greater visual surface roughness as compared to the non-etched region. This roughness has a certain fine periodicity and profile that better retains dampening fluid as compared, for example, to a non-textured surface.

Figure 4:
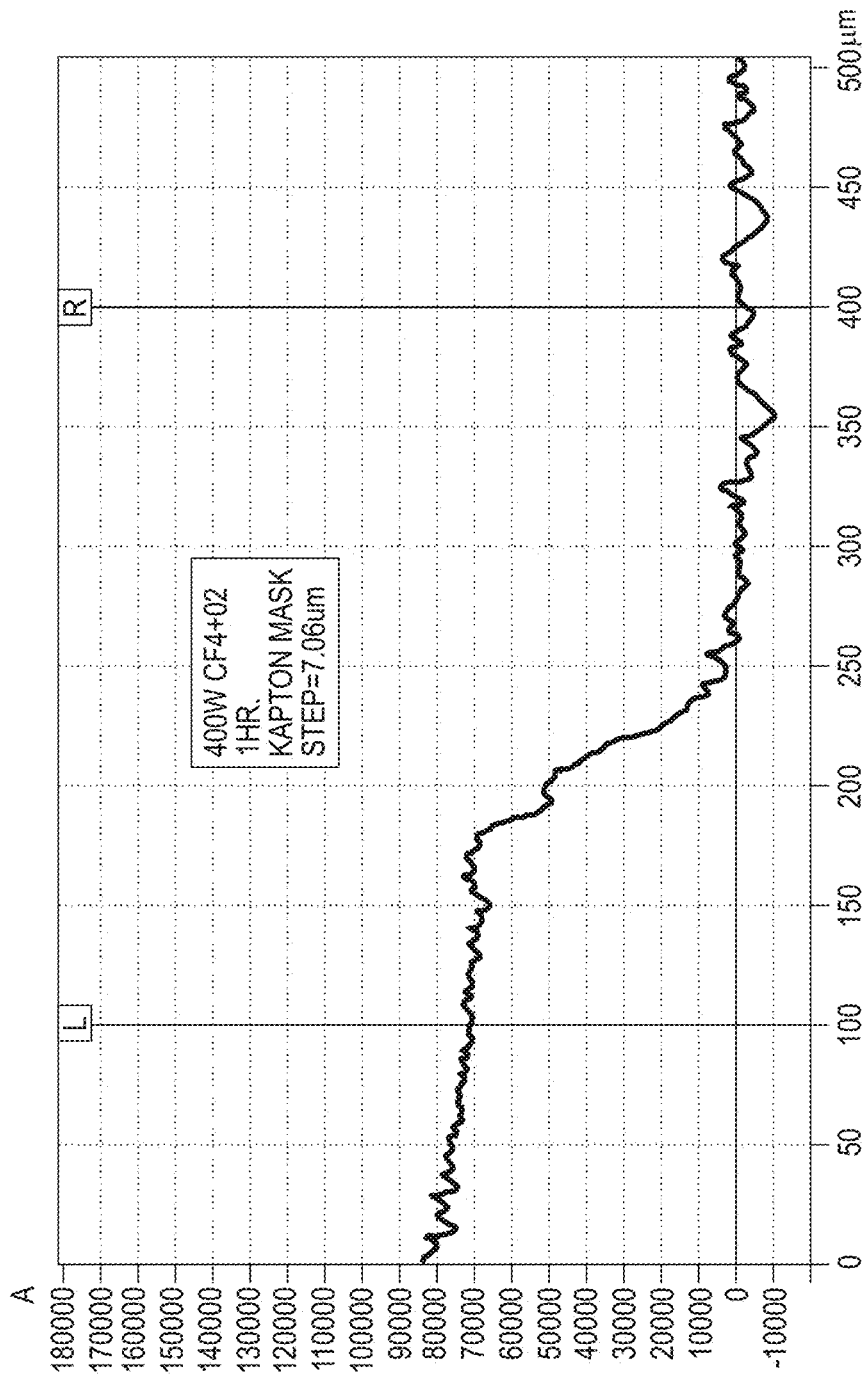
FIG. 4 is a plot of etching depth versus lateral position for a partially masked sample using a dry etch process.

In one embodiment using a dry etch, ultra-fine surface texturing of various polymer surfaces have been demonstrated with average surface roughness (Ra) of approximately 0.5 microns (μm). This average surface roughness is a reasonable value for use as an imaging blanket in a digital lithography printing system. Experiments on both dry and wet etch of elastomeric polymer sheets were performed. With reference to FIG. 4, isotropic dry etch using a barrel etcher with 400 W $CF_4+O_2$ plasma resulted in elastomeric polymer surface material removal at an average etch rate of 0.11 μm per minute of etch time. The left-most portion of FIG. 4 has been masked with a Kapton mask, while the right-most portion was unmasked during etch. Post-etch SEM inspection revealed that the isotropic plasma etched surface exhibited randomly disposed high points with a linear separation several microns or less (see also, FIG. 3B). A reactive ion etch (RIE) type of anisotropic ($CF_4/SF_6$) plasma etch was also shown to create a matte dull elastomeric polymer surface after etching. These were then tested with dampening fluid and were demonstrated to capture and retain a very thin layer of dampening fluid for at least four seconds.

Figure 5:
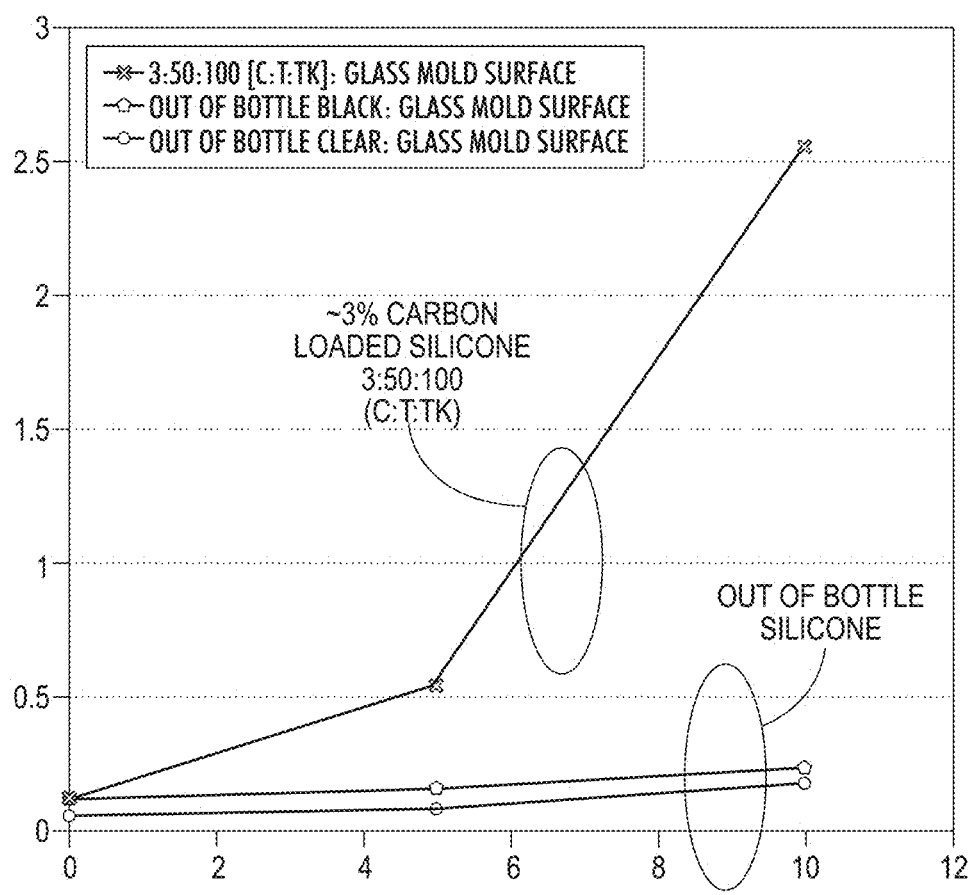
FIG. 5 is a plot of etched roughness (Ra) against wet etch time for three silicone material types.

Several different candidate imaging blanket materials have been evaluated in an etch regime. Referring to FIG. 5, etched roughness (Ra) has been plotted against wet etch time for three silicone material types. The three types shown are "out of the bottle clear" (Dow Toray SE9187L clear), "out of the bottle black" (dark tinted silicone, Dow Toray SE9187L black) and 3:50:100 (C:T:TK, where C is carbon, T is toluene, and TK is Dow Toray SE9187L black, out-of-bottle, the ratios by mass prior to curing) a custom formulation with about 3% by weight carbon content. The extra carbon loading into the silicone matrix in this third example was found to significantly contribute to creating a higher surface roughness ($R_a$).

(At least in part, this is due to the different etching rates as between the matrix material and the carbon, the result of which is illustrated in the surface textures shown in the various figures of the present disclosure.) Here, $R_a$, the surface roughness average, is defined by:

$$R_a = \frac{1}{N}\sum_{i=1}^{N} |Z_i|$$

where $Z_i$ is defined to be the distance from the measured point to the mean plane.

Samples of each material were prepared and examined. Samples were molded over a glass molding surface. The silicone surface in contact with the glass forms the test (printing) surface. It will be noted from FIG. 5 that the sample having the 3% by weight carbon showed desirable increased surface roughness following etching as compared to the other samples. This is illustrated, for example, in the data from experiments performed on these samples shown in FIG. 6. While $R_a$ is one metric typically used to characterize the average roughness of a surface, RMS roughness ($R_q$), Ave Max Profile Height ($R_z$), and Max Profile Height ($R_t$) are also useful roughness parameters to consider (the later may be susceptible to interference by particulates and dirt particles). These values are determined, respectively, as:

$$R_q = \sqrt{\frac{1}{N}\sum_{i=1}^{N} Z_i^2}$$

$$R_z = \frac{1}{N}\left(\sum_{i=1}^{N} H_i - \sum_{i=1}^{N} L_i\right)$$

where $H_i$ is defined to be the $i^{th}$ highest point on the surface and $L_i$ is defined to be the $i^{th}$ lowest point on the surface $$R_t = R_p + R_v$$

where $R_p$ (maximum profile peak height) is defined as the distance between the highest point on the surface and the mean height of the surface, and $R_v$ (maximum profile valley depth) is defined as the distance between the lowest point on the surface and the mean height of the surface.

Figure 7A:
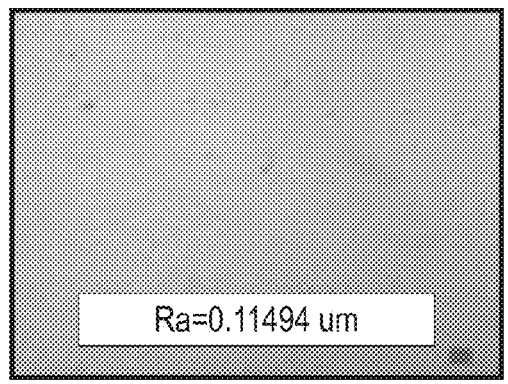
FIGS. 7A-7C are micrographs (100× magnification, reference bar represents 5 μm) of wet-etch times for a silicone compound formed over a glass mold surface containing 3% by weight carbon at 0 minutes, 5 minutes, and 10 minutes of etch time, respectively.
Figure 7B:
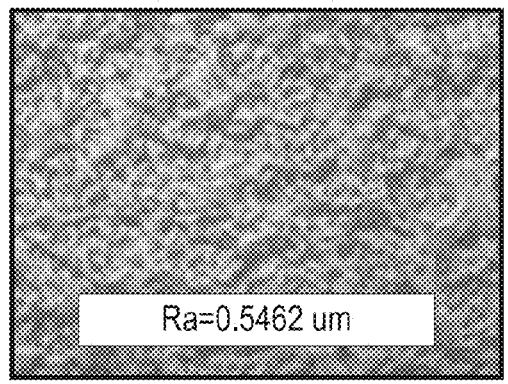
Figure 7C:
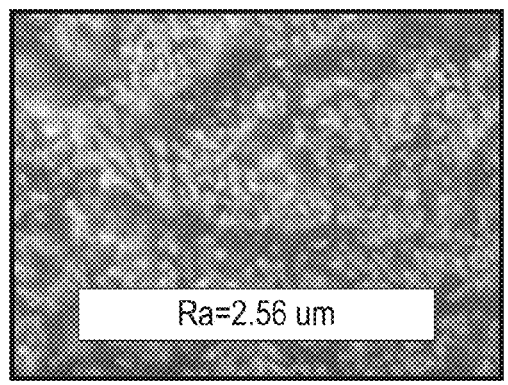
Figure 8A:
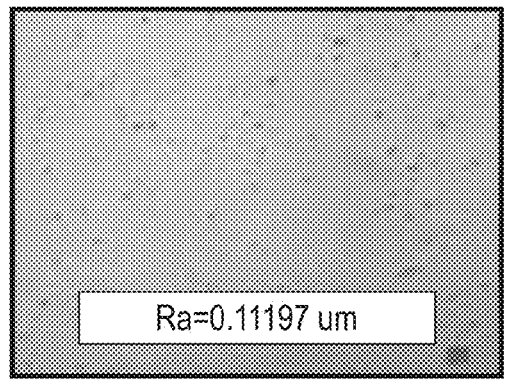
FIGS. 8A-8C are micrographs (100× magnification, reference bar represents 5 μm) of wet-etch times for a black silicone compound formed over a glass mold surface at 0 minutes, 5 minutes, and 10 minutes of etch time, respectively.
Figure 8B:
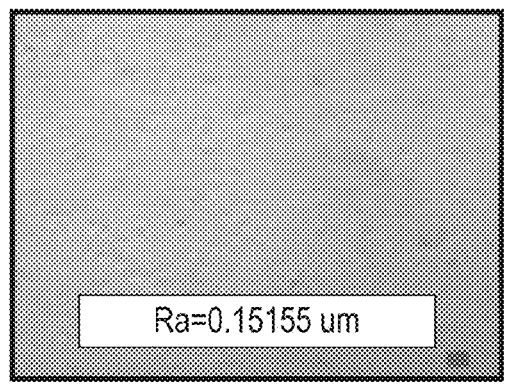
Figure 8C:
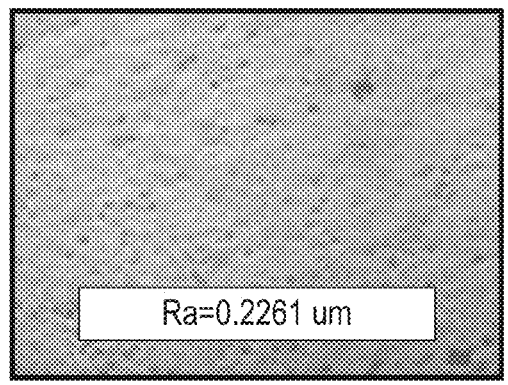
Figure 9A:
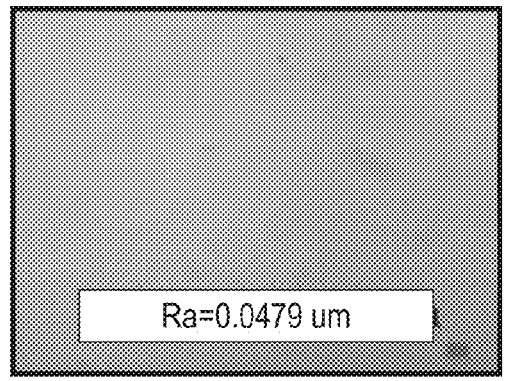
FIGS. 9A-9C are micrographs (100× magnification, reference bar represents 5 μm) of wet-etch times for a clear silicone compound formed over a glass mold surface at 0 minutes, 5 minutes, and 10 minutes of etch time, respectively.
Figure 9B:
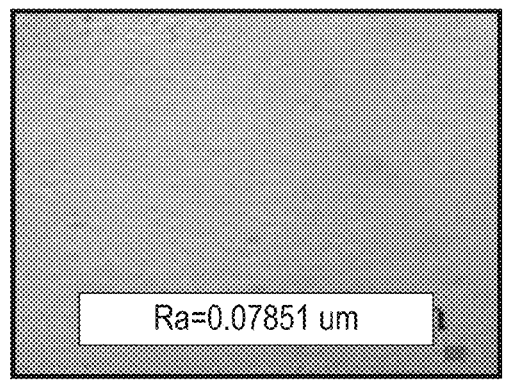
Figure 9C:
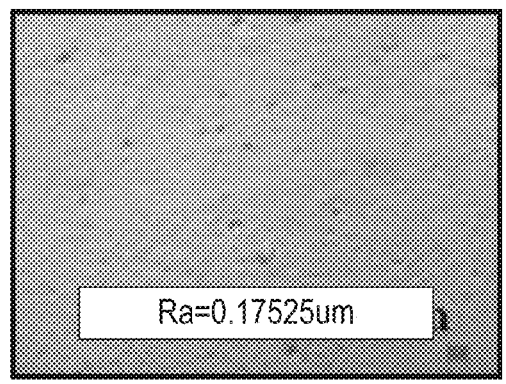
Figure 10A:
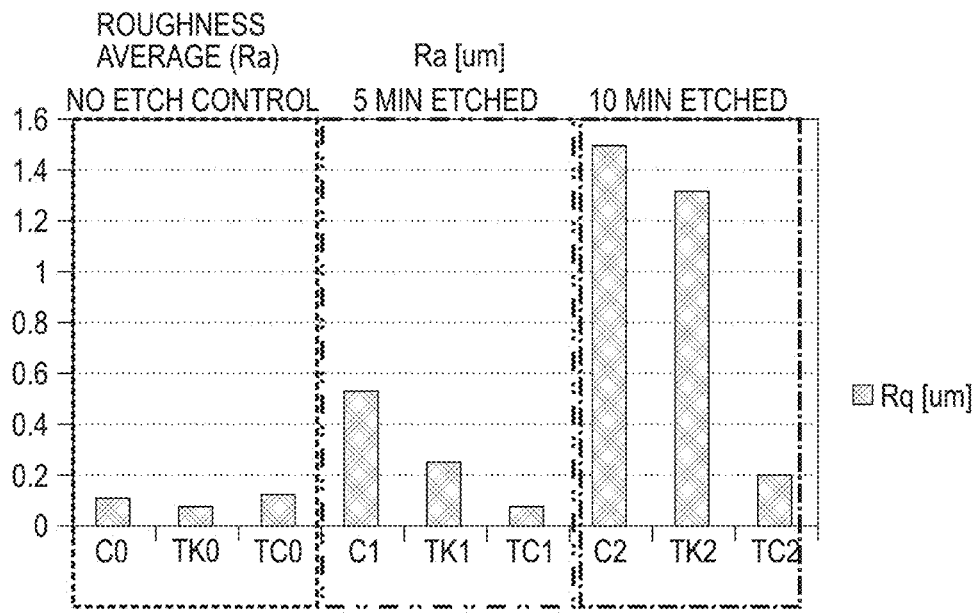
FIGS. 10A-10D are plots of various roughness measures for a 3% carbon by weight silicone system, an "out of the bottle" commercial black silicone system, and an "out of the bottle" commercial clear silicone system.
Figure 10B:
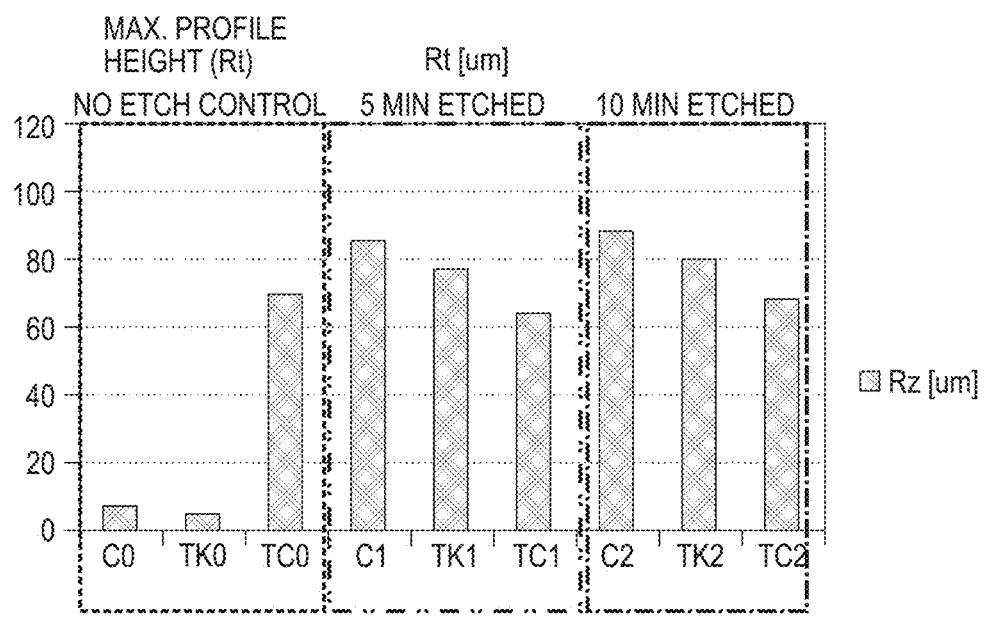
Figure 10C:
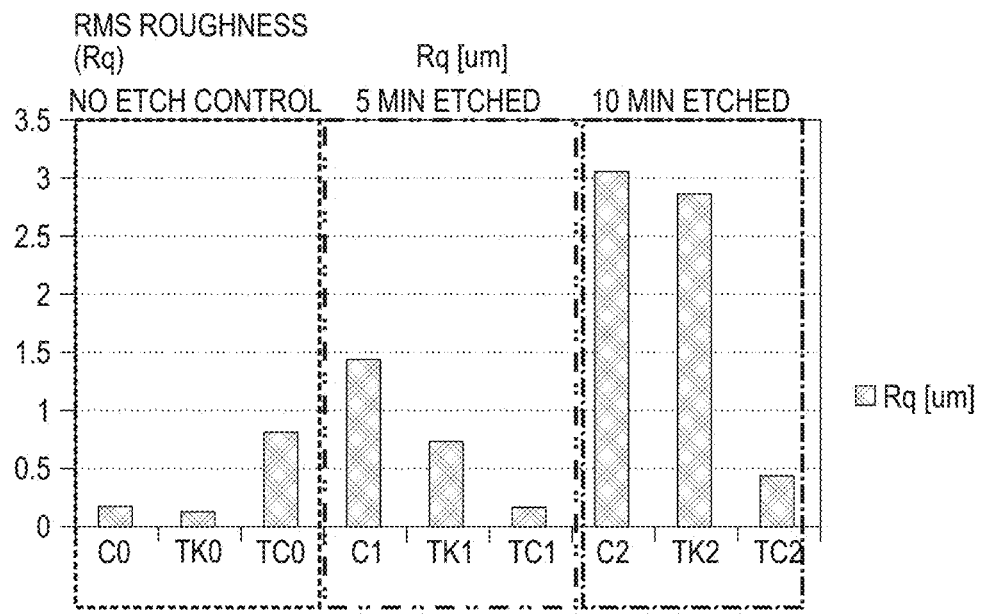
Figure 10D:
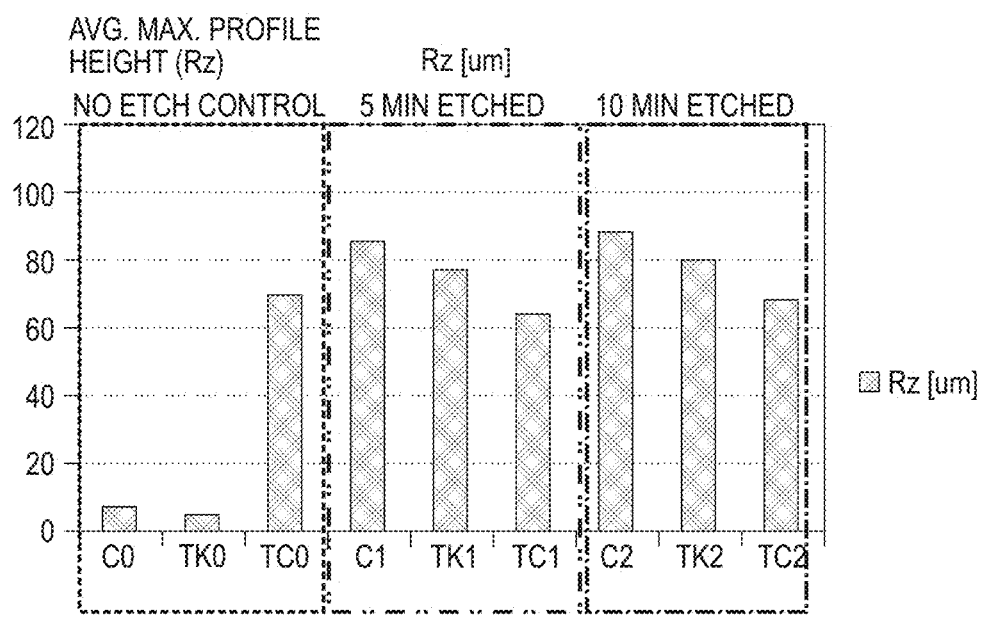

With reference to FIGS. 7A-7C, 8A-8C, and 9A-9C, microscope micrographs (100× magnification, reference bar represents 5 μm) are shown of three additional wet etched silicone material surfaces. In these figures, all silicone surfaces were formed over a glass mold. FIGS. 7A-7C illustrate increasing wet-etch times for a silicone compound containing 3% by weight carbon, 0 minutes, 5 minutes, and 10 minutes of etch time, respectively. FIGS. 8A-8C illustrate increasing wet-etch times for an "out of the bottle" black silicone compound with 0 minutes, 5 minutes, and 10 minutes of etch time, respectively. FIGS. 9A-9C illustrate increasing wet-etch times for an "out of the bottle" clear silicone compound with 0 minutes, 5 minutes, and 10 minutes of etch time, respectively. Average roughness ($R_a$) has also been recorded for each of these etch and material conditions. The etch evaluation here illustrates that the silicone etched surface became more roughened with increased carbon content (by weight percent) and etch time, and that a black out of the bottle silicone etched more than a clear out of the bottle silicone.

Comparison of roughness measures and etching profiles for a wet etched 3% by weight carbon silicone surface are illustrated in FIGS. 10A-10D. C0 represents the unetched 3% carbon by weight silicone system, C1 represents the 3% carbon by weight silicone system wet etched for 5 minutes, and C2 represents the 3% carbon by weight silicone system wet etched for 10 minutes. TK0 represent the unetched out of the bottle black Dow Toray SE9187L system, TK1 represents the out of the bottle black Dow Toray SE9187L system wet etched for 5 minutes, and TK2 represents the out of the bottle black Dow Toray SE9187L system wet etched for 10 minutes. TK0 represent the unetched out of the bottle clear Dow Toray SE9187L system, TK1 represents the out of the bottle clear Dow Toray SE9187L system wet etched for 5 minutes, and TK2 represents the out of the bottle clear Dow Toray SE9187L system wet etched for 10 minutes. A benchmark $R_a$ of 0.5 µm was obtained with the 5 minute wet etched sample C1. This illustrates that an $R_a$ figure of 0.5 µm can be achieved on the 3% by weight carbon loaded silicone material using a 5 minute wet etch.

Figure 11:
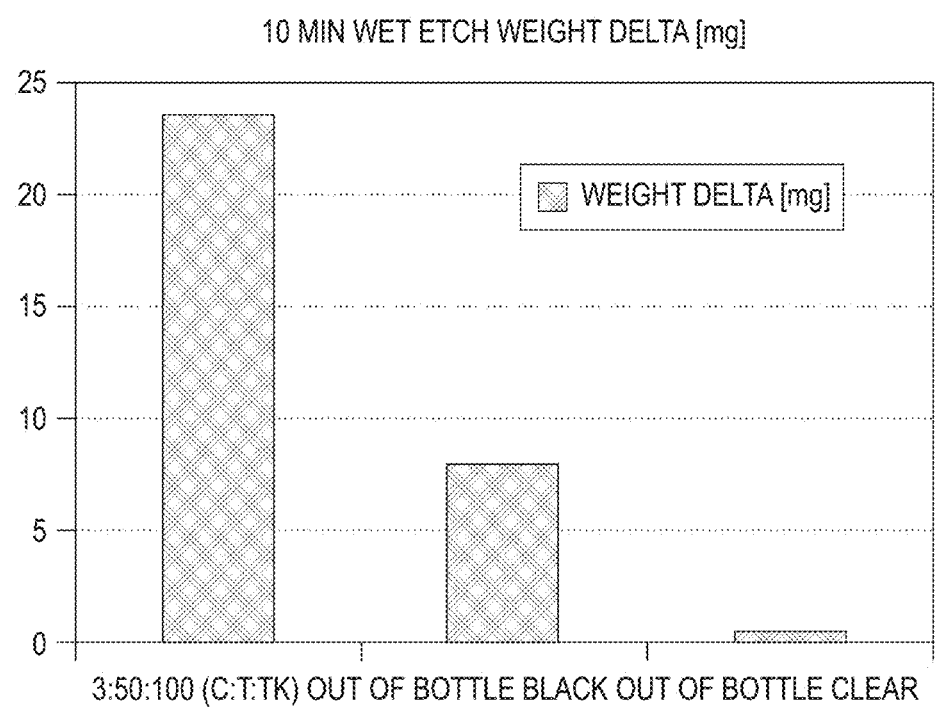
FIG. 11 is a plot of material removal in a wet etch process for a 3% carbon by weight silicone system, an "out of the bottle" commercial black silicone system, and an "out of the bottle" commercial clear silicone system.

Another measure of the effectiveness of the etch process for texturing an elastomeric polymer surface useful as a printing blanket in a variable data digital lithography system is the extent of material removal during the texture process. A comparison of material removal for the three subject material systems is illustrated in FIG. 11, that illustrates the material weight removed during a 10 minute wet etch process for the 3% carbon by weight silicone system, the out of the bottle black silicone, and the out of the bottle clear silicone, respectively. As can be seen, the wet etch process removed the most material by weight from the 3% carbon by weight sample (3:50:100). Etching removed the least weight from the out of the bottle clear (no carbon) sample. One conclusion that may be drawn is that by removing the most material, the etch of the 3% carbon by weight sample is confirmed to have the highest microroughness of the samples tested.

Figure 12:
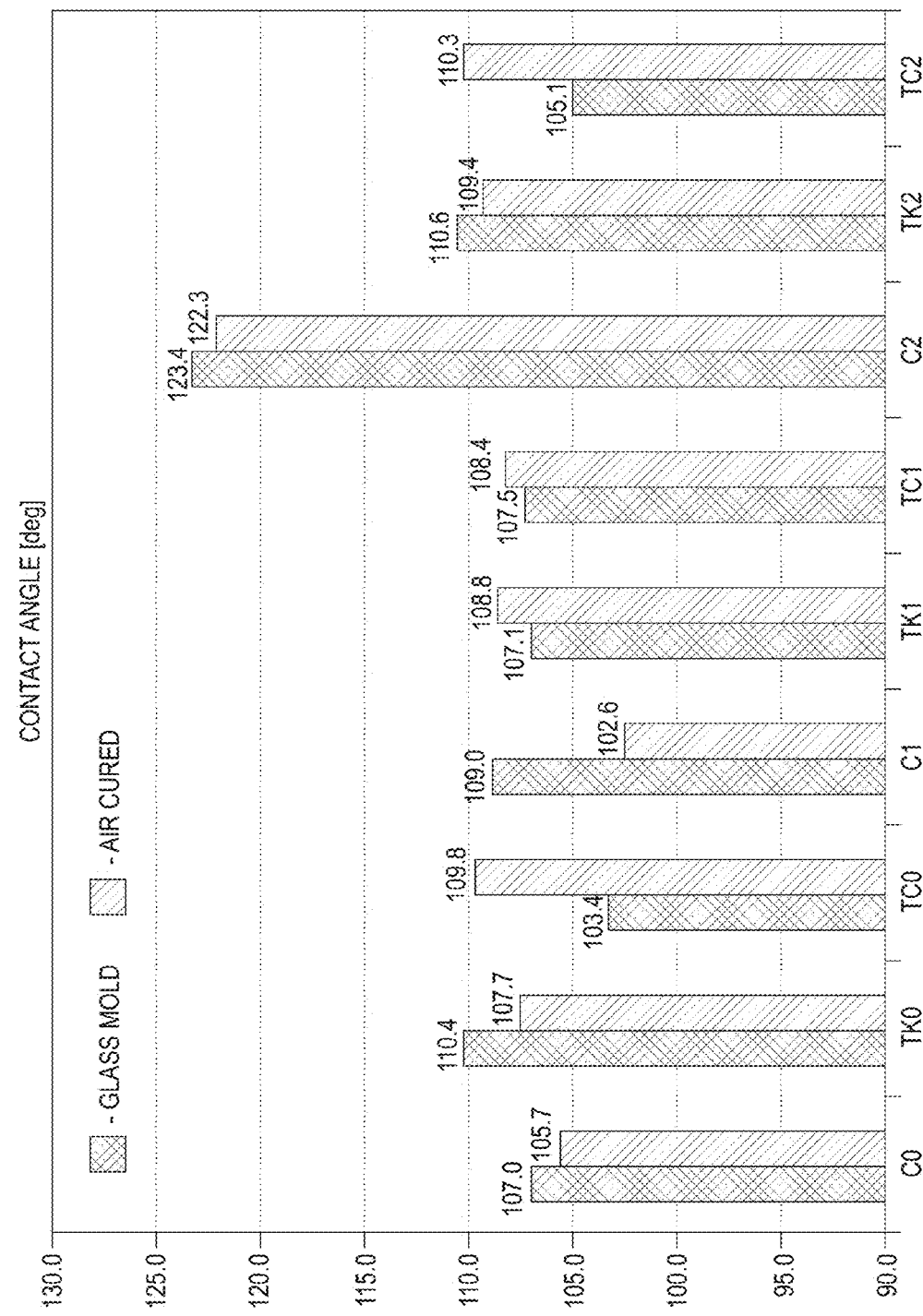
FIG. 12 is a plot of contact angle for a 3% carbon by weight silicone system, an "out of the bottle" commercial black silicone system, and an "out of the bottle" commercial clear silicone system, and for each system an air-cured surface and a surface formed over a glass mold surface.

Water contact angle for etched surfaces of the three sample systems discussed above has also been measured to confirm the assumption that the increased roughness of the etched 3% carbon by weight silicone system provides improved dampening fluid retention as compared to the other systems. Results of this investigation are shown in FIG. 12. Again, C0 represents the unetched 3% carbon by weight silicone system, C1 represents the 3% carbon by weight silicone system wet etched for 5 minutes, and C2 represents the 3% carbon by weight silicone system wet etched for 10 minutes. TK0 represent the unetched out of the bottle black Dow Toray SE9187L system, TK1 represents the out of the bottle black Dow Toray SE9187L system wet etched for 5 minutes, and TK2 represents the out of the bottle black Dow Toray SE9187L system wet etched for 10 minutes.

Plasma etch conditions as well as other imaging blanket materials have been studies in support of the present disclosure. Different plasma gas compositions, powers, and geometries were used and the resulting textures compared. The plasma electrode geometry will greatly impact the etch properties of the plasma. In a reactive-ion-etch (RIE) system the sample to be etched is placed directly on the electrode. Because of this, reactive species in the plasma are accelerated into the substrate. The resulting etch has a strong mechanical component and is anisotropic.

In addition to RIE systems, conventional plasma etch geometries were investigated, where the samples to be etched is spaced apart from the electrodes. In this geometry reactive species are not accelerated into the substrate, and as a result the plasma etch does not possess as much of a mechanical, sputtering behavior as observed in RIE. The sample is primarily etched chemically by the reactive species in the plasma resulting in an isotropic etch with a slower etch rate.

Figure 13A:
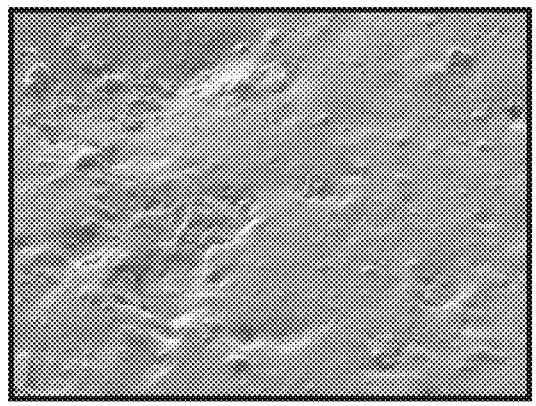
FIGS. 13A-13D are scanning electron micrographs, taken at a 45 degree angle, of a fluorosilicone blanket which is unetched, RIE etched, and etched using conventional plasmas, respectively.
Figure 13B:
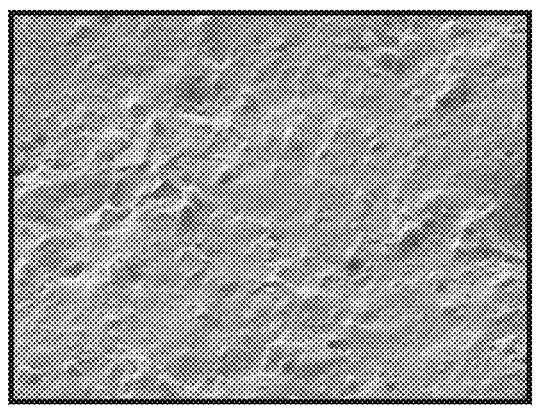
Figure 13C:
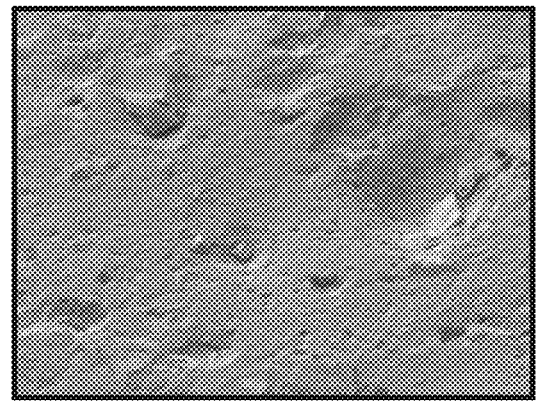
Figure 13D:
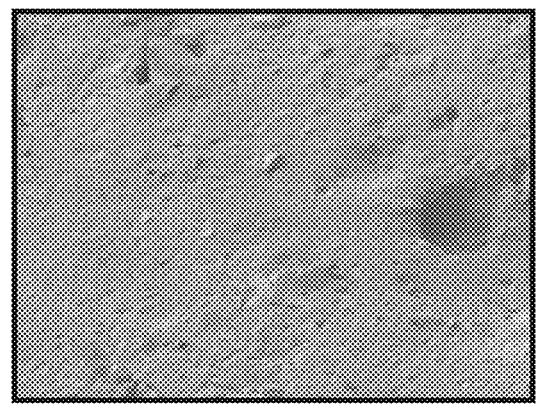
Figure 14A:
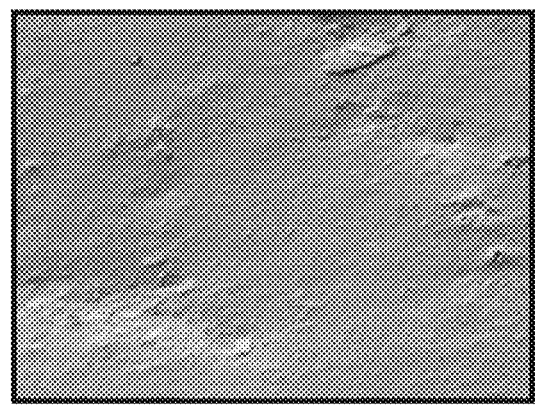
FIGS. 14A-14D are scanning electron micrographs, taken at a 45 degree angle, of a viton blanket which is unetched, RIE etched, and etched using conventional plasmas, respectively.
Figure 14B:
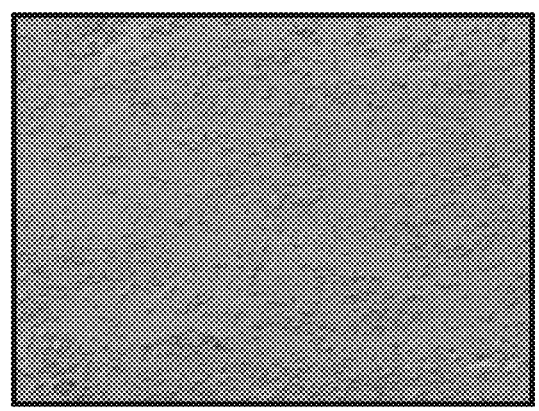
Figure 14C:
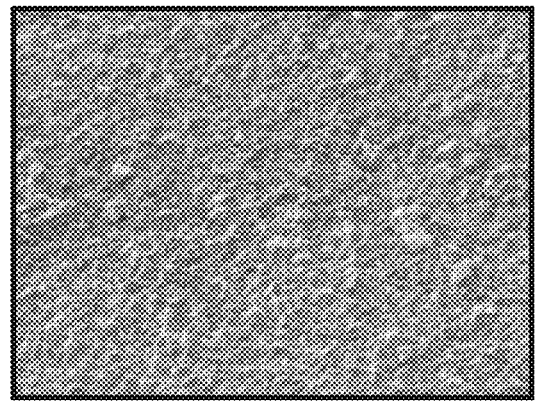
Figure 14D:
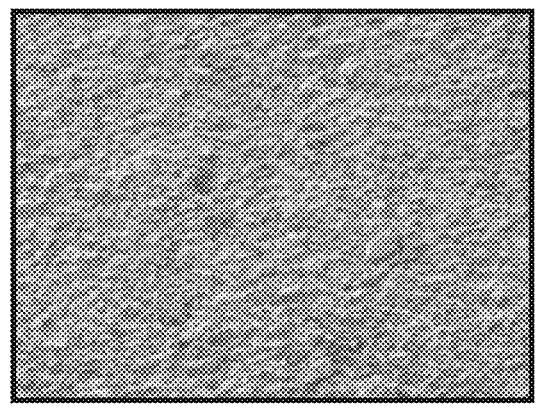

FIGS. 13A-13D show scanning electron micrographs, taken at a 45 degree angle, of a fluorosilicone blanket which is unetched (FIG. 13A), RIE etched (FIG. 20B) and etched using conventional plasmas (FIGS. 13C and 13D). FIGS. 14A-14D show scanning electron micrographs, taken at a 45 degree angle, of a Viton (E. I. du Pont de Nemours and Company) blanket which is unetched (FIG. 14A), RIE etched (FIG. 14B) and etched using conventional plasmas (FIGS. 14C and 14D).

FIGS. 13B-13D and 14B-14D for both fluorosilicone and Viton, respectively, show an increase in very fine texture that may be desirable for printing applications. This increased fine texture is particularly pronounced in the viton sample. These figures suggest that anisotropic chemical plasma etching may be particularly suitable for generating fine texture in elastomeric polymer films.

Figure 15A:
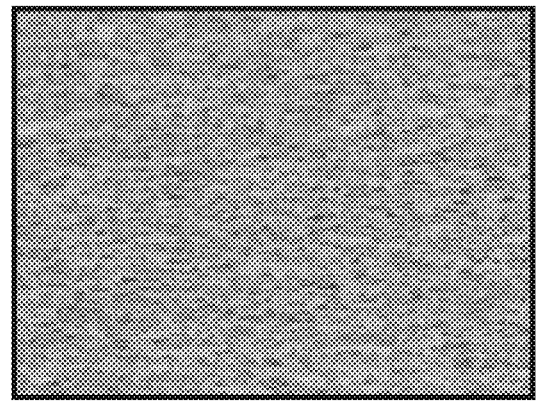
FIGS. 15A-15D are scanning electron micrographs, taken at an 85 degree angle, of a fluorosilicone blanket which was etched with a mixture of $CF_4$ and $O_2$, $O_2$ only, $SF_6$ and $O_2$, and $SF_6$ only, respectively.
Figure 15B:
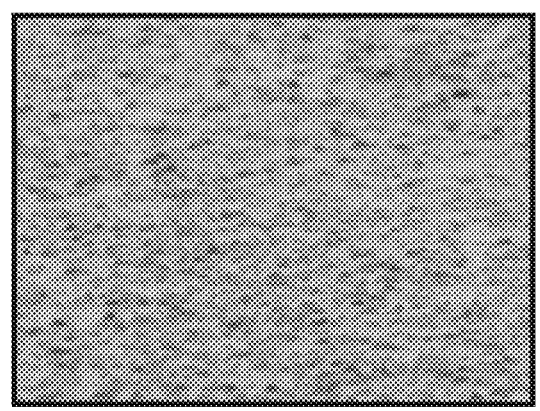
Figure 15C:
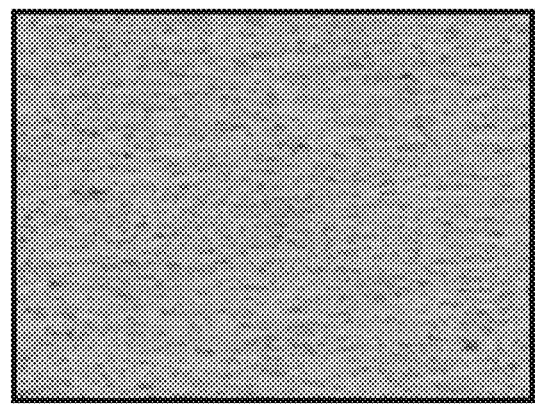
Figure 15D:
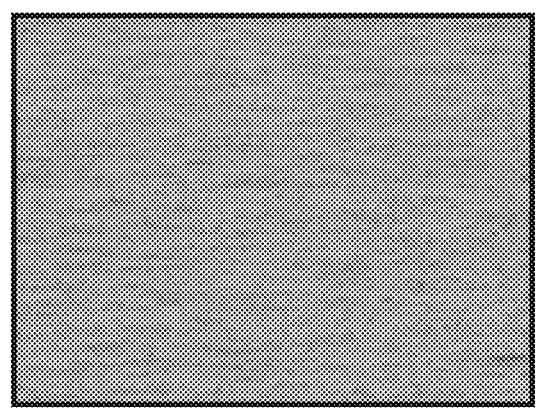

Various etchant gas compositions have been explored in order to better understand what parameters provide us with the desired surface texture. Specifically we have considered various concentrations of $CF_4$, $SF_6$ and $O_2$. FIGS. 15A-15D show scanning electron micrographs, taken at an 85 degree angle, of a fluorosilicone blanket which was etched with a mixture of $CF_4$ and $O_2$ (FIG. 15A), $CF_4$ only (FIG. 15B), $SF_6$ and $O_2$ (FIG. 15C), and $SF_6$ only (FIG. 15D). From these figures we see that a desirable texture is formed using the $CF_4$ chemistry (FIGS. 15A and 15B) and that increased oxygen composition seems to result in a finer texture (FIGS. 14A and 15C (as compared to the textures produced in 15B and 15D, respectively).

Figure 16A:
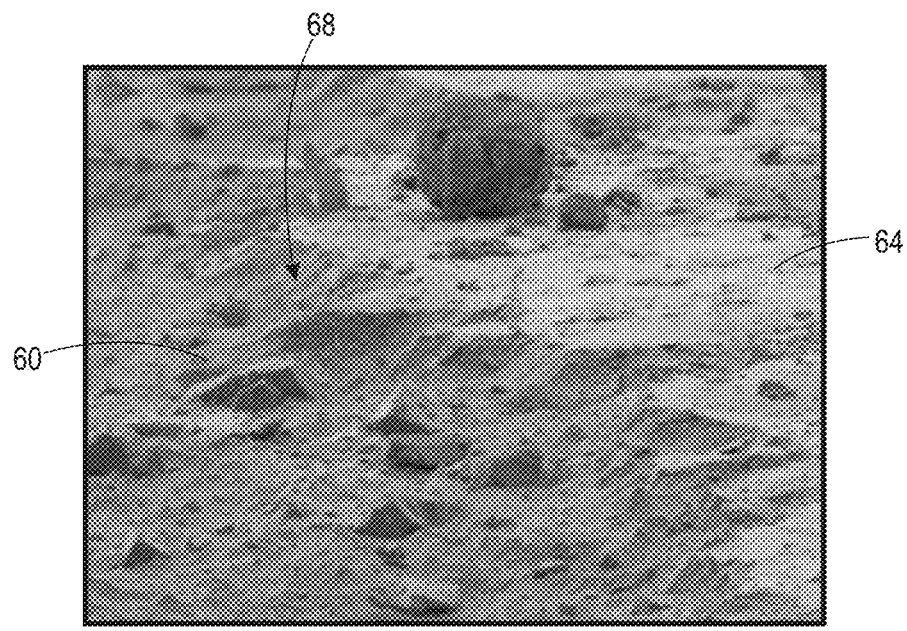
FIGS. 16A-16B are scanning electron micrographs, taken at an 85 degree angle, of a fluorosilicone blanket etched with mixtures of $CF_4$ and $O_2$, respectively.
Figure 16B:
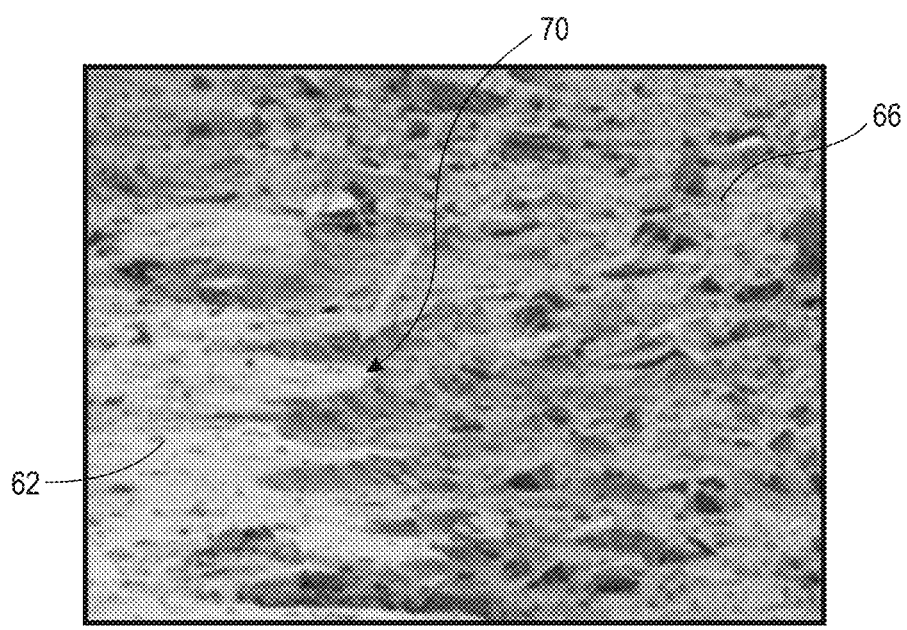

FIGS. 16A-16B show scanning electron micrographs, taken at an 85 degree angle, of a fluorosilicone blanket etched with mixtures of $CF_4$ and $O_2$. Both images show an etched region 60, 62 and an unetched region 64, 66, respectively. The etch depth is clearly visible at the step indicated by the arrows 68, 70. The plasma used to produce the surface of FIG. 16A had just over than twice the $O_2$ concentration as the plasma used to produce the surface of FIG. 16B. This illustrates that the increased oxygen composition provides a significantly higher vertical etch rate.

From the above we conclude that one appropriate etchant gas chemistry for achieving a desired texture on an elastomeric polymer imaging blanket is a combination of $CF_4$ with a small amount of $O_2$. This does, however, contemplate other candidates for creating texture, such as $NF_3$, etc.

We have also explored texturing an imaging blanket surface through plasma etching where the imaging blanket includes certain filler materials. Adding filler materials within a polymer matrix can be used to create a specific surface texture by etching away the polymer matrix material while leaving behind protruding filler particles at the surface. The selected filler material must have a much slower etch rate than the polymer matrix in which it is embedded. The final surface texture can be designed by selecting the size and density of the filler material. These aspects of the filler will impact the final depth and spacing of surface features of the blanket.

Figure 17A:
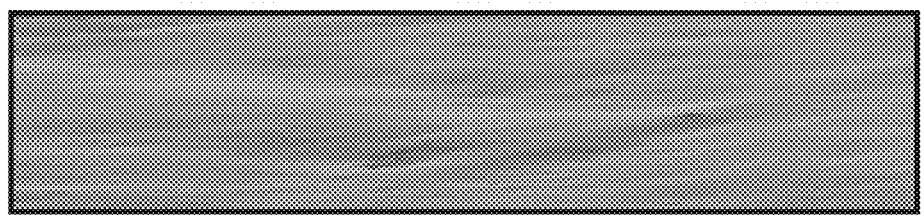
FIGS. 17A-17C are scanning electron micrographs, taken at 85 degrees to surface normal, of the initial surface, 1 minute of etch, 5 minutes of etch of a silicone system including an aerogel granular material disposed therein.
Figure 17B:
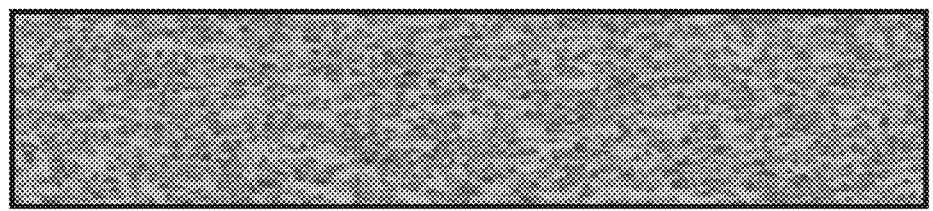
Figure 17C:
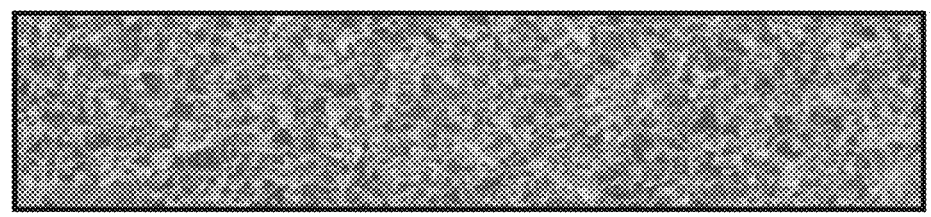
Figure 17D:
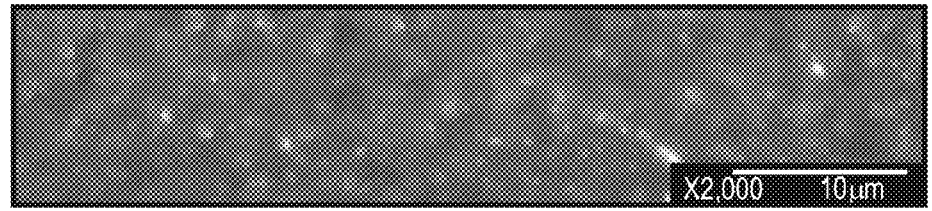
FIG. 17D is a cross section of the initial surface shown in FIG. 17A.

FIGS. 17A-17D show scanning electron micrographs of a plasma etched elastomeric polymer matrix with an embedded filler material taken at 85 degrees to surface normal. The polymer matrix is made up of a commercially available silicone and the filler material used is a ground-up carbon aerogel. The carbon aerogel is less susceptible to the plasma etch (in one case $CF_4$, $SF_6$, $O_2$ at 200 watts) and is left protruding at the surface after the etch. The figures show the initial surface of the elastomeric polymer matrix with embedded particles (FIG. 17A), the surface after 1 minute of etching (FIG. 17B), after 5 minutes of etching (FIG. 17C) and the cross section of the sample prior to etching (FIG. 17D). FIGS.

17B and 17C illustrate that as the etch time is increased more aerogel material is exposed resulting in a rougher surface texture. The final surface can be engineered by specifying the size and density of the embedded aerogel as well as the etch time used to expose it.

This approach has been explored using plasma etching, but is equally valid for any subtractive process which removes the matrix material selectively over the filler material. Examples of additional approaches could include chemical etches or physical abrasion assuming the appropriate materials and conditions are selected.

Figure 18:
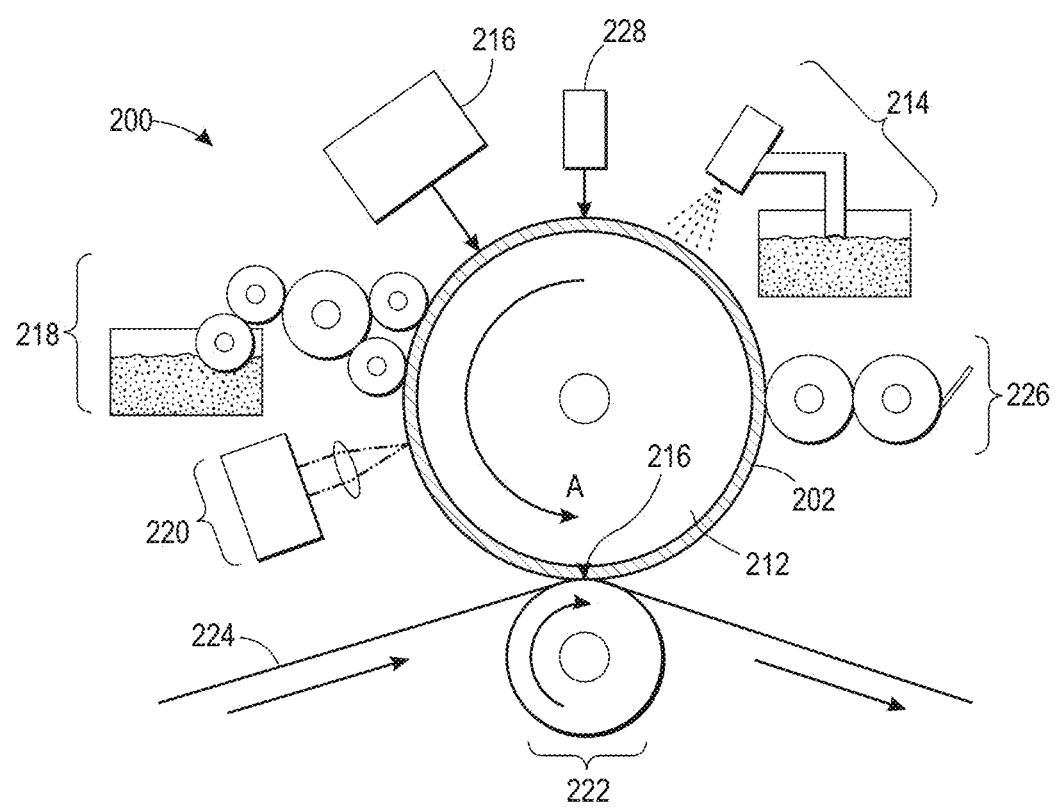
FIG. 18 is a side view of a variable data lithography system including a silicone imaging blanket, having a patterned imaging surface, affixed to a printing member therein, according to an embodiment of the present disclosure.

As mentioned, the elastomeric polymer imaging blanket, having a patterned imaging surface formed by the above described molding process may be affixed to a printing member in a variable data lithography system. With reference to FIG. 18, one example of such a system 200 for variable data lithography is illustrated. System 200 comprises an imaging member 212, in this embodiment a drum, but may equivalently be a plate, belt, etc. The aforementioned molded and surface-etched elastomeric polymer imaging blanket 202 may be applied over member 212, for example by an appropriate adhesive permitting temporary adhesion of blanket 202 to the surface of member 212. Blanket 202 is mounted such that the patterned imaging surface faces outward.

In certain embodiments, imaging member 212, with imaging blanket 202 applied thereto, is surrounded by one or more of: a direct-application dampening fluid subsystem 214 (although other than direct application subsystems may also be used), an optical patterning subsystem 216, an inking subsystem 218, a rheology (complex viscoelastic modulus) control subsystem 220, transfer subsystem 222 for transferring an inked image from the surface of imaging blanket 202 to a substrate 224, and finally a surface cleaning subsystem 226. Many optional subsystems may also be employed, but are beyond the scope of the present disclosure. In general, said variable data lithography system may be operated such that an image is produced by exposing a dampening fluid over said imaging blanket to radiation to thereby remove a portion of said dampening fluid, selectively forming ink in regions where said dampening fluid has been removed, and causing a substrate to be in physical contact with said ink to thereby transfer said ink from said imaging blanket to said substrate. Many of these subsystems, as well as operation of the system as a whole, are described in further detail in the aforementioned U.S. patent application Ser. No. 13/095,714.

It should be understood that when a first layer is referred to as being "on" or "over" a second layer or substrate, it can be directly on the second layer or substrate, or on an intervening layer or layers may be between the first layer and second layer or substrate. Further, when a first layer is referred to as being "on" or "over" a second layer or substrate, the first layer may cover the entire second layer or substrate or a portion of the second layer or substrate.

The physics of devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

While examples and variations have been presented in the foregoing description, it should be understood that a vast number of variations exist, and these examples are merely representative, and are not intended to limit the scope, applicability or configuration of the disclosure in any way. For example, the designed surface texture method disclosed herein can also be used to enable an Anilox- or Gravure-type of ink metering roller where the Anilox or Gravure cells are the designed ink pockets to retain the printing ink. Furthermore, while a framed molding process has been described, other methods for forming an elastomeric printing plate material as a blanket are contemplated herein. Such approaches include but are not limited to calendaring, using a bird bar, flow-coating or using a draw down process. All of these approaches may produce an imaging surface that would benefit from being wet or dry etched to produce texture, as disclosed above.

Accordingly, disclosed herein is, inter alia, a native elastomeric polymer etching used to define the ultra-fine surface texturing of imaging blankets, the resulting blankets, as well as a system using same. Imaging blankets with such an ultra-fine surface texture provide improved retention a very thin layer of dampening fluid that defines the dark field non-printing surface area, while providing a surface supporting radiative vaporization, ablation, etc. of dampening fluid, a material surface hardness suitable for transfer printing, and a minimal transfer of material from the imaging blanket surface to the dampening fluid or ink formed thereover.

While examples and variations have been presented in the foregoing description, it should be understood that a vast number of variations exist, and these examples are merely representative, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described examples may be made without departing from the spirit and scope of the disclosure defined by the claims thereto.

What is claimed is:

1. A method of forming an elastomeric imaging blanket for a printing apparatus, the imaging blanket having an imaging surface configured to transfer an image to a substrate during a printing process of the printing apparatus, the method comprising:

preparing a mold for receipt of an elastomeric polymer blanket compound, the mold having an open surface for introduction of the elastomeric polymer blanket compound into the mold and a molding surface opposite the open surface;

introducing the elastomeric polymer blanket compound in liquid state into the mold at the open surface;

curing the elastomeric polymer blanket compound to produce the elastomeric imaging blanket, a first surface of the elastomeric imaging blanket being exposed to air during the curing, and a second surface opposite the first surface being in contact with the molding surface during the curing;

releasing the elastomeric imaging blanket from the mold; and uniformly etching one of the first surface and the second surface of the elastomeric imaging blanket to form a texture pattern therein, the one of the first surface and the second surface forming the imaging surface of the elastomeric imaging blanket.

2. The method of claim 1, wherein the polymer blanket compound is selected from the group consisting of: fluorosilicone, fluorocarbon-based synthetic rubber, and silicone.

3. The method of claim 2, wherein the polymer blanket compound further comprises substantially 3-25 percent by weight carbon.

4. The method of claim 1, wherein the etching is performed by a dry etch process.

5. The method of claim 4, wherein the dry etch process comprises an anisotropic plasma etching process using a combination of $CF_4$, $SF_6$ and $O_2$ species.

6. The method of claim 5, wherein the dry etch process comprises a reactive ion etching process using a combination of $CF_4$, $SF_6$ and $O_2$ species.

7. The method of claim 1, wherein the etching is performed by a wet etch process.

8. The method of claim 7, wherein the wet etch process comprises application of a solution of TBAF and NMP to the imaging surface.

9. The method of claim 1, wherein the etching is performed by a combination of dry etching and wet etching.

10. The method of claim 1, wherein the elastomeric polymer blanket compound has dispersed therein 3-25 percent by weight granular filler material.

11. The method of claim 10, wherein the etching has a greater material removal rate for the polymer as compared to the granular material.

12. The method of claim 10, wherein the etching has a greater material removal rate for the granular material as compared to the polymer.

13. The method of claim 10, wherein the granular material comprises carbon.

14. The method of claim 1, wherein the etching is configured to provide the imaging surface with a periodic surface roughness, Ra, of substantially between 0.1 and 1.5 microns.

15. The method of claim 1, wherein the uniformly etching includes etching the first surface of the elastomeric imaging blanket to form the texture pattern therein.

16. The method of claim 1, wherein the uniformly etching includes etching the second surface of the elastomeric imaging blanket to form the texture pattern therein.

17. A method of forming a molded elastomeric imaging blanket for a printing apparatus, the imaging blanket having an imaging surface configured to transfer an image to a substrate during a printing process of the printing apparatus, the method comprising:

preparing a mold structure for receipt of a fluorosilicone elastomeric blanket compound, the mold structure having at least one glass molding surface, the mold structure having an open surface for introduction of the elastomeric polymer blanket compound into the mold structure, the open surface being opposite the molding surface;

introducing the fluorosilicone elastomeric blanket compound in liquid state into the mold structure at the open surface, the fluorosilicone elastomeric blanket compound comprising dispersed 3-25 percent by weight carbon;

curing the blanket compound to produce the molded imaging blanket, a first surface of the imaging blanket being exposed to air during the curing, and a second surface opposite the first surface being in contact with the molding surface during the curing;

releasing the imaging blanket from the mold structure; and uniformly etching the second surface of the imaging blanket formed in physical contact with the glass molding surface to form a texture pattern therein, the etched second surface forming the imaging surface of the imaging blanket.

18. The method of claim 17, wherein the etching is performed by a dry etch process comprises an anisotropic reactive ion etching process using a combination of $CF_4$ and $O_2$ species.

19. The method of claim 17, wherein the fluorosilicone elastomeric blanket compound comprises a granular material, the etching configured to provide a greater material removal rate for the fluorosilicone elastomeric blanket compound as compared to the granular material.

20. A method of forming a molded elastomeric imaging blanket for a printing apparatus, the imaging blanket having an imaging surface configured to transfer an image to a substrate during a printing process of the printing apparatus, the method comprising:

preparing a mold structure for receipt of a fluorosilicone elastomeric blanket compound, the mold structure having at least one glass molding surface, the mold structure having an open surface for introduction of the elastomeric polymer blanket compound into the mold structure, the open surface being opposite the molding surface;

introducing the fluorosilicone elastomeric blanket compound in liquid state into the mold structure at the open surface, said fluorosilicone elastomeric blanket compound comprising a dark tinted material with substantially 3-25 percent by weight carbon and granular material;

curing the fluorosilicone elastomeric blanket compound to produce the molded elastomeric imaging blanket, a first surface of the molded elastomeric imaging blanket being exposed to air during the curing, and a second surface opposite the first surface being in contact with the molding surface during the curing;

releasing the molded imaging blanket from the mold structure; and uniformly etching the second surface of the imaging blanket formed in physical contact with the glass molding surface to form a texture pattern therein, the etched second surface forming the imaging surface of the imaging blanket, the etching configured to provide a greater material removal rate for the fluorosilicone elastomeric blanket compound as compared to the granular material;

the etching is further configured to provide the imaging surface with a periodic surface roughness, Ra, of substantially between 0.1 and 1.5 microns.

* * * * *